US005573428A

United States Patent [19]

Biggs et al.

[11] Patent Number: 5,573,428

[45] Date of Patent: Nov. 12, 1996

[54] HERMETIC ELECTRICAL CONNECTOR

[75] Inventors: Bradley M. Biggs, Gilbert; Christopher F. Norton, Laveen; Louis P. Farace, Mesa, all of Ariz.

[73] Assignee: Motorola, Inc., Schaumburg, Ill.

[21] Appl. No.: 265,368

[22] Filed: Jun. 24, 1994

[51] Int. Cl.$^6$ .......................... H01R 13/658; H05K 1/00

[52] U.S. Cl. .......................... 439/566; 174/255; 174/260; 439/684; 439/714

[58] Field of Search .......................... 439/74, 75, 44, 439/46, 936, 371, 714, 684, 544; 361/411, 398; 174/260, 68, 255, 256

[56] References Cited

U.S. PATENT DOCUMENTS

| | | | |
|---|---|---|---|
| 3,167,608 | 1/1965 | Mason | 439/714 X |
| 3,798,762 | 3/1974 | Harris et al. | 174/256 |
| 4,480,151 | 10/1984 | Dozier | 439/544 X |
| 4,662,691 | 5/1987 | Derdzinski | 439/74 |
| 4,712,161 | 12/1987 | Pryor | 361/411 |
| 4,800,461 | 1/1989 | Dixon et al. | 361/398 |
| 5,119,272 | 6/1992 | Ohyama et al. | 174/260 X |
| 5,241,456 | 8/1993 | Marcinkiewicz et al. | 361/792 |
| 5,357,403 | 10/1994 | Haller et al. | 174/255 X |

FOREIGN PATENT DOCUMENTS

| | | | |
|---|---|---|---|
| 5315029 | 11/1993 | Japan | 439/684 |

*Primary Examiner*—William Briggs
*Attorney, Agent, or Firm*—Bradley J. Botsch, Sr.; Jeffrey D. Nehr

[57] ABSTRACT

A low profile hermetic electrical connector includes a conductive layer with opposite first and second conductive layer surfaces. An inner electrical isolation layer is coupled between the first conductive layer surface and a first contact and an outer electrical isolation layer is coupled between the second conductive layer surface and a second contact. A contact interconnector electrically couples the first contact and the second contact through the inner electrical isolation layer, the conductive layer, and the outer electrical isolation layer without electrically contacting the conductive layer, creating a serpentine, low flow path for vapor through the adhesive layers. In a hermetic electrical cable end connector, the first contact is electrically coupled to a first conductor through a first interconnector and a second contact is electrically coupled to a second conductor through a second interconnector. Two additional electrical isolation layers are required. Applications include use in electronic safe and arming devices.

14 Claims, 3 Drawing Sheets

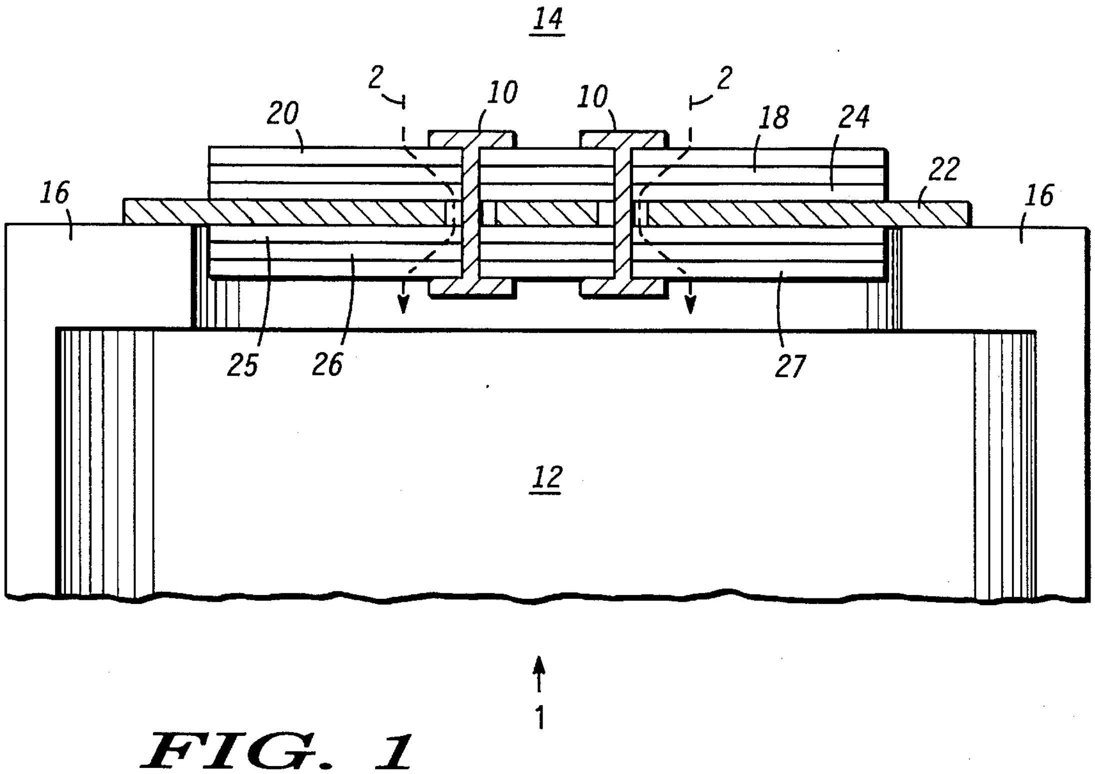
FIG. 1
FIG. 2
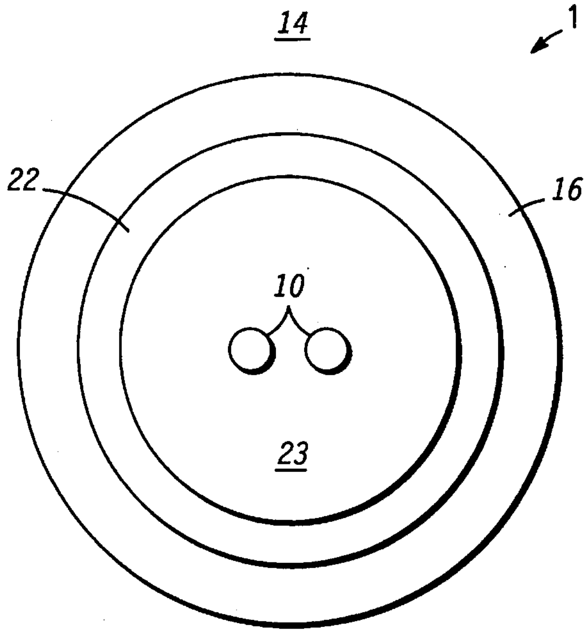

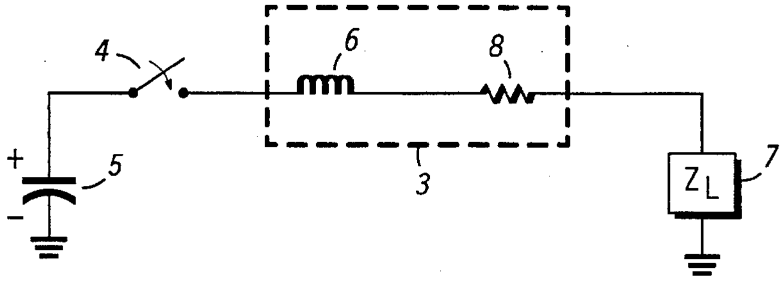
FIG. 3
FIG. 4
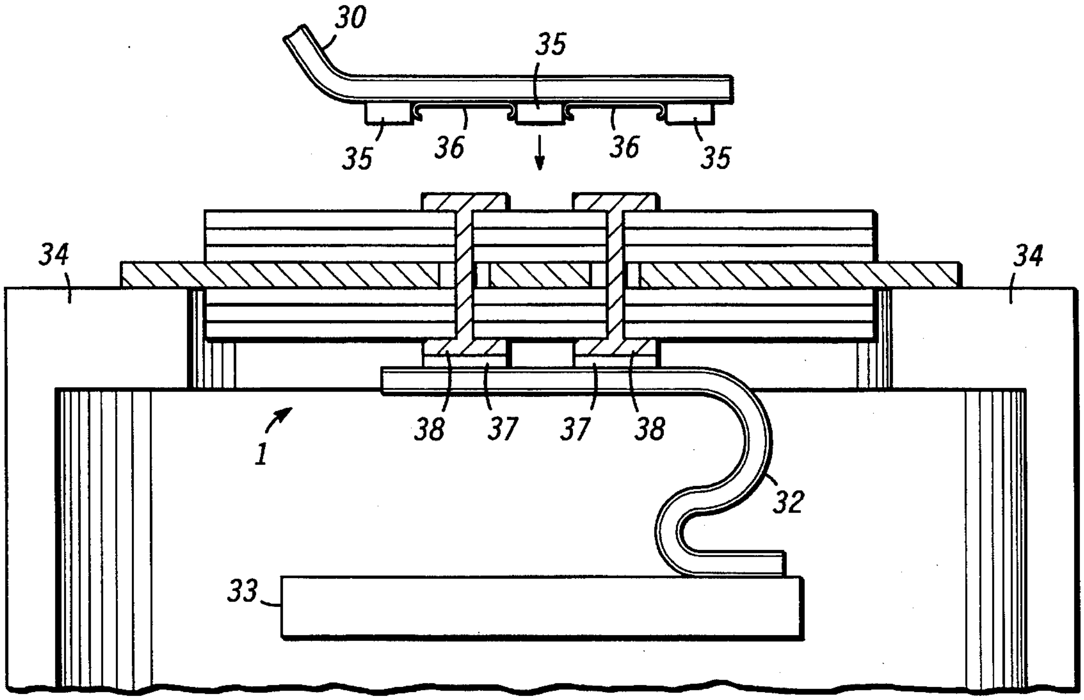

HERMETIC ELECTRICAL CONNECTOR

FIELD OF THE INVENTION

This invention relates in general to electrical connectors, and in particular to hermetic electrical connectors.

BACKGROUND OF THE INVENTION

Hermetic electrical connectors are important to a significant number of industries, in a significant number of applications. An example includes use with the electronic safe and arming device industry, where exploding foil initiator technology slapper detonators are used to initiate warheads or distribute payloads in missiles, guided projectiles, and submunitions. Other examples of such use are in oil recovery, mining, and demolition devices.

The need for hermetic connections arises from the effects of moisture and water condensation in electronic packages. Salts and ionic contaminants dissolved within the moisture serve to degrade the reliability of electrical components inducing both ohmic changes in electrical connections as well as chemical changes in semiconductor materials. To prevent the undesirable degradation of performance which often results, low leakage hermetic connections are needed to preclude or minimize moisture intrusion and the associated chemical activity.

Typical hermetic connectors presently used include glass to metal seals or ceramic/metal feed-throughs. These connectors suffer from a number of disadvantages. Such connectors are expensive due to the thermal processing required to fire and cure the glass and ceramic materials. They are also sensitive to mechanical shock because of the brittle nature of the glass and ceramic materials. Since brittle materials are inherently weak in flexure, they are typically designed to take advantage of the stronger shear properties of glass. The resulting configurations are inherently thick, which causes large inductive losses for high current applications.

Harnesses involving multiple conductors and flat cable feed-throughs also exhibit leakage at the edges, where imperfect blending of the cable laminations occurs in areas of non-uniform thickness. Unwanted leakage paths are induced within the cable-referred to as "soda straw" leakage—making the connection susceptible to moisture intrusion where it passes through a bulkhead from outside of an electronic package to inside.

Therefore, what is needed is a flexible, inexpensive, low profile hermetic electrical connection to provide means to maintain a low moisture volume within an electrical package to assure high reliability and long service life.

BRIEF DESCRIPTION OF THE DRAWINGS

In FIG. 1, there is shown a side view of a hermetic seal electrical connector in accordance with a preferred embodiment of the invention;

In FIG. 2, there is shown a top view of the hermetic seal electrical connector in FIG. 1;

In FIG. 3, there is shown the electrical equivalent circuit for the hermetic seal electrical connector of FIGS. 1 and 2 in an electronic sating and arming device application;

In FIG. 4, there is shown a side view of the hermetic seal electrical connector of FIG. 1 in an electronic sating and arming device application; and In FIG. 5, there is shown a side view of a hermetic seal electrical connector integral to an electrical cable.

DETAILED DESCRIPTION OF THE PREFERRED EMBODIMENT

Figure 5:
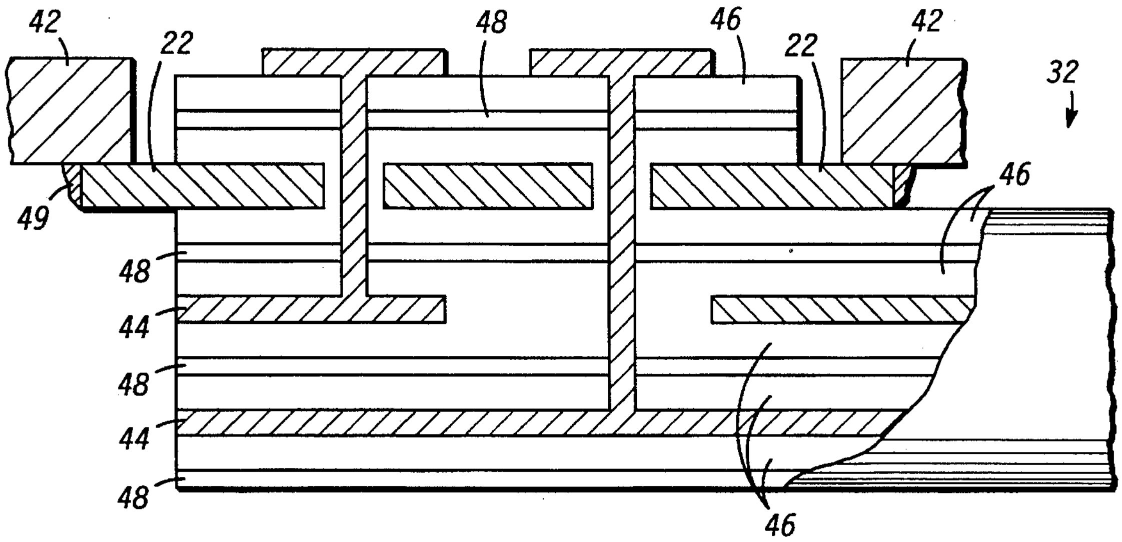

Generally, the present invention provides a hermetic electrical connector and method for efficiently passing electrical connections through a bulkhead. While the hermetic connector described is particularly suited for the particular applications described below, other applications for the hermetic connector will be readily apparent to those of skill in the art.

The key features of this connector are: a serpentine path for vapor flow through the connector; a low profile giving the connector a low electrical impedance; a continuous surface for adhesion to eliminate the "soda straw" exhibited by slotted connectors; and the capability to be integrated into a cable.

The serpentine path for vapor flow is a result of the overlapping metal layers of the connector. The metal layers block vapor flow and force the vapor to travel through the adhesive layers in a serpentine path. This results in a lower vapor flow rate through the connector. The low profile of the connector is the result of thin metal, adhesive and insulator layers. It is the thin metal layers that determine the low electrical impedance of the connector. A single continuous layer for adhesion prevents this connector from exhibiting the "soda straw" effect that is common in slotted connectors. The capability of the connector to be implemented with a cable instead of metal layers results in an even lower profile for the connector. As is shown and explained below, incorporating the interior portion of the connector in a cable as a second embodiment also eliminates several assembly steps from a first embodiment.

The present invention can be more fully understood with reference to the figures. FIG. 1 illustrates a cross-sectional view of a hermetic connector 1 in accordance with a preferred embodiment of the invention. Contacts 10 provide the electrical connection between the inside of the isolated container 12 and the outside of the container 14, separated by a container barrier, i.e. bulkhead 16. While FIG. 1 illustrates two contacts, a plurality of contacts could easily be employed, depending on the number of electrical connections required to be passed through the container bulkhead 16. Contacts 10 can be of individual unitary construction e.g. eyelets or formed by plating and etching techniques familiar to those in the art. Contacts 10 are attached to dielectric 18 by adhesive layer 20. Adhesive layers 20 and 27 are optional. Shown in unitary form in FIG. 1, contacts 10 are electrically coupled by a narrow contact interconnector region, the cross sectional area of which is less than the area of contacts 10. In the preferred embodiment, the contact interconnector region is substantially perpendicular to the laminar layers described below.

Dielectric 18 in FIG. 1 provides an electrical isolation layer and can be polyimide or any insulator of sufficient strength to prevent arcing between contacts 10 and metal or conductive layer 22. Adhesive layer 24 attaches dielectric 18 on a second surface to conductive layer 22 and further isolates contacts 10 from electrically shorting to each other. Conductive layer 22 is welded, soldered, or adhesively attached to bulkhead 16. A second surface of conductive layer 22 is bonded to dielectric layer 26 by adhesive layer 25. Dielectric layer 26 acts as an electrical isolation layer.

Adhesive layers 24 and 25 maintain electrical isolation between contacts 10 and conductive layer 22. Adhesive layer 27 is used to bond the interior faces of metal contacts 10 to dielectric layer 26. While shown as substantially planar, or flat layers in FIG. 1, the nature of adhesive layers 20, 24, 25, and 27 is such that upon application of heat and pressure during fabrication, adhesive layers 20, 24, 25, and 27 flow sufficiently to fill all air space between adjacent layers.

The planar or laminar arrangement of contacts 10, adhesive layers 20 and 24, dielectric layers 18 and 26, and the conductive layer 22 provides a barrier to moisture and other outside contaminants resulting in only a long serpentine path such as shown in lines 2 through which moisture can intrude into the assembly (moisture intrusion is impossible directly through the metal contacts 10 and the conductive layer 22, leaving only the dielectric and adhesive as moisture paths).

The moisture leak rate through the connection can be described from the following equation:

$$\text{Leak Rate} = \frac{\text{Moisture Vapor Transmission Rate} \times \text{Area}}{\text{Length}}$$

Thus, the leakage is low since adhesive layers 20 and 24 can be made thin (on the order of 0.0501 mm, or about 2 mils) and long (on the order of 0.3175 cm, or about one-eighth inch).

The hermetic electrical connector in FIG. 1 exhibits a small area term in the equation by virtue of the dielectric 18 and adhesive thickness 20. The length term is maximized by the planar configuration which results in the serpentine path 2. The connector 1 which results is also low in inductance minimizing electrical losses for applications such as in electronic safe and arm devices where currents exceeding several thousand amperes are typically induced through contacts 10.

FIG. 2 shows a top view in accordance with a preferred embodiment of the invention in FIG. 1, illustrating how conductive layer 22 has an exposed portion at the periphery. The hermetic electrical connector fits against the bulkhead 16 at the exposed conductive layer 22/bulkhead 16 points of contact (which are sealed, for example, by soldering, welding or adhesive). An embedded section of conductive layer 22 lies below the adhesive layer 20, between dielectric layers 18 and 26 and adhesive layers 24 and 25 (see FIG.

The top view of FIG. 2 also depicts the projected face area presented to moisture in the outside environment 14. Since moisture cannot pass through either the solid metal of contacts 10 or the embedded conductive layer 22 directly, intrusion can only take place under and around the contacts—a path which is long and has reduced penetrable face area.

FIG. 3 shows an electrically equivalent circuit for connector 1 in accordance with a preferred embodiment of this invention. FIG. 3 includes a series connection of a charged high-voltage capacitor 5 through a high voltage switch 4 to the electrically equivalent hermetic connector 3 and electrical load 7 to electrical ground. The electrically equivalent hermetic connector 3 comprises a connector equivalent resistance 8 and a connector equivalent inductance 6. The electrical load 7 in this application can be an exploding foil initiator for an electric safing and arming device.

As an example of the improvement produced with hermetic connector 1, consider the electrical performance of the hermetic connector 1 where high currents momentarily pass through contacts 10. Since the losses from induction are given as:

$$\text{Voltage Loss} = \text{Inductance} * dI/dt,$$

it can be seen that the effect of an extremely high dI/dt term can be minimized by the very low inductance which hermetic connector 1 provides.

FIG. 4 illustrates an application of the hermetic connector 1 in FIG. 1, in accordance with a preferred embodiment of the invention. FIG. 4 includes cable terminations 30 and 32 which mate with the hermetic connector 1 on opposite sides of hermetic connector 1. The hermetic connector 1 separates the interior of a fuze housing 34 in which cable terminations 32 and fireset printed wiring board (PWB) 33 reside from the outside of the fuze housing, which includes cable termination 30 (e.g., the cable to the exploding foil initiator. The cable terminations 32 reside within a packaged electronics unit, while terminations 30 connect to removable explosives exposed to the storage environment.

The hermetic connector 1 in FIG. 4 is coupled through contacts 38 to the cable terminations 32. Cable terminations 32 can be connected to contacts 38 with solder 37. A second end of cable terminations 32 is connected to fireset PWB. On the opposite side of hermetic connector 1 in FIG. 4 (i.e. the outside of the fuze housing 34), cable terminations 30 have insulating adhesive pads 35 to couple to the hermetic connector 1 adhesive layer 20 (see FIG. 1 ). Spring contacts 36 adjacent to the adhesive pads 35 on the underside of cable terminations 30 are held against metal contacts 10 of the hermetic connector 1 when the cable terminations 30 are coupled to the hermetic connector 1.

The hermetic connector 1 in the FIG. 4 application serves to minimize the intrusion of moisture into the electronics package while continuing to maintain a low loss electrical connection since the connector 1 is of low profile and consequently low in inductance. Typical low inductance values measured for flat planar structures are in the 20 to 30 nanohenry range.

FIG. 5 illustrates a second application of the hermetic connector 1 of FIG. 1, in accordance with a preferred embodiment of the invention. In FIG. 5, a cable end is configured to integrally include the hermetic connector 1 as a feature of its design. Conductive layer 22 is welded to the underside of the bulkhead 42 by welds 49. Conductive layer 22 can also be attached to bulkhead 42 with solder or adhesive. Metal conductors 44 and dielectric layers 48 are layered within adhesive layers 46 such that contacts 10 are coupled to conductors 44. Since moisture cannot pass the conductive layer 22, the only path for moisture intrusion is through the thickness of the dielectric layer 48 and adhesive layers 46. The FIG. 5 configuration integrates the features of connector 1 from FIG. 1 into cable termination ending 32 eliminating solder connection 37 previously shown in FIG. 4. The series of laminations resulting can form the cable to fireset PWB connection.

Compared with the FIG. 1 implementation, two additional electrical isolation layers, i.e. dielectric layers 48, are required to isolate the second conductor in FIG. 5. In the preferred embodiment, the adhesive layers 46, the dielectric layers 48, and the conductive layer 22 are each substantially planar and of uniform thickness. The first interconnector and the second interconnector which coupled the first and second contacts to the first and second conductors, respectively, are substantially perpendicular to the laminar layers described above in the preferred embodiment. The maximum first interconnector cross sectional area and the maximum second interconnector cross sectional area are each smaller than the either of the areas of the first and second contacts.

Thus, a hermetic electrical connector and method has been described which overcomes specific problems and accomplishes certain advantages relative to prior art methods and mechanisms. The improvements over known technology are significant. The planar hermetic connector approach described herein provides a low cost means of making electrical connection through a bulkhead barrier intended to separate a moisture bearing environment from the environment within an electronic package required to be dry and moisture-free. The hermetic electrical connector can be made of common materials routinely used in the art for cable fabrication and does not employ glass or other brittle materials commonly used to preclude moisture intrusion. This results in an inexpensive, flexible shock-resistant connection able to withstand the rigors of transportation, handling, and drop. In addition, the number of laminations can be increased to reduce moisture penetration as desired.

Thus, there has also been provided, in accordance with an embodiment of the invention, a hermetic seal electrical connector and method that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A hermetic electrical connector comprising:

a conductive layer with opposite first and second conductive layer surfaces;

an inner electrical isolation layer coupled to the first conductive layer surface through a first inner adhesive layer;

an outer electrical isolation laver coupled to the second conductive layer surface through a first outer adhesive layer;

a first contact coupled to the inner electrical isolation layer through a second inner adhesive layer;

a second contact coupled to the outer electrical isolation layer through a second outer adhesive layer; and a contact interconnector electrically coupling the first contact and the second contact through the inner electrical isolation layer, the conductive layer, and the outer electrical isolation layer without electrically contacting the conductive layer, wherein the second inner adhesive layer, the inner electrical isolation layer, the first inner adhesive layer, the conductive layer, the first outer adhesive layer, the outer electrical isolation layer, and the second outer adhesive layer are each substantially planar and of uniform thickness.

2. A hermetic electrical connector as claimed in claim 1, wherein the contact interconnector is substantially perpendicular to the second inner adhesive layer, the inner electrical isolation layer, the first inner adhesive layer, the conductive layer, the first outer adhesive layer, the outer electrical isolation layer, and the second outer adhesive layer.

3. A hermetic electrical connector as claimed in claim 1 wherein the first contact covers a first contact area on the inner electrical isolation layer, the second contact covers a second contact area on the outer electrical isolation layer, and the contact interconnector has a maximum interconnector cross sectional area, such that the first contact area and the second contact area are each larger than the maximum interconnector cross sectional area.

4. A hermetic electrical cable end connector comprising:

a conductive layer with opposite first and second conductive layer surfaces;

a first electrical isolation layer coupled to the first conductive layer surface;

a second electrical isolation layer coupled to the second conductive layer surface;

a first conductor coupled to the second electrical isolation layer opposite the conductive layer;

a first contact electrically coupled to the first conductor through a first interconnector;

a third electrical isolation layer coupled to the first conductor opposite second electrical isolation layer;

a second conductor coupled to the third electrical isolation layer;

a second contact electrically coupled to the second conductor through a second interconnector; and a fourth electrical isolation layer coupled to the second conductor opposite the third electrical isolation layer.

5. A hermetic electrical cable end connector as claimed in claim 4, wherein the first electrical isolation layer is coupled to the first conductive layer surface through a first adhesive layer.

6. A hermetic electrical cable end connector as claimed in claim 5, wherein each of the first electrical isolation layer, the second electrical isolation layer, the third electrical isolation layer, and the fourth electrical isolation layer comprise a dielectric layer.

7. A hermetic electrical cable end connector as claimed in claim 5, wherein the first contact and the second contact are each coupled to the first adhesive layer.

8. A hermetic electrical cable end connector as claimed in claim 4, wherein the conductive layer, the first electrical isolation layer, the second electrical isolation layer, the third electrical isolation layer, and the fourth electrical isolation layer are each substantially planar and of uniform thickness.

9. A hermetic electrical cable end connector as claimed in claim 8, wherein the first interconnector and the second interconnector are each substantially perpendicular to the conductive layer, the first electrical isolation layer, the second electrical isolation layer, the third electrical isolation layer, and the fourth electrical isolation layer.

10. A hermetic electrical cable end connector as claimed in claim 9, wherein the first contact covers a first contact area and the second contact covers a second contact area on the first adhesive layer, the first interconnector has a maximum first interconnector cross sectional area and the second interconnector has a maximum second interconnector cross sectional area, and the first contact area and the second contact area are each larger than either the maximum first interconnector cross sectional area or the maximum second interconnector cross sectional area.

11. A thin profile, low impedance hermetic electrical connector with low vapor flow throughput, the hermetic electrical connector comprising:

a conductive layer with opposite first and second conductive layer surfaces;

a inner electrical isolation layer coupled to the first conductive layer surface through a first inner adhesive layer;

a outer electrical isolation layer coupled to the second conductive layer surface through a first outer adhesive layer;

a first contact coupled to the inner electrical isolation layer through a second inner adhesive layer;

a second contact coupled to the outer electrical isolation layer through a second outer adhesive layer; and a contact interconnector electrically coupling the first contact and the second contact through the inner electrical isolation layer, the conductive layer, and the outer electrical isolation layer without electrically contacting the conductive layer, wherein the first contact covers a first contact area on the inner electrical isolation layer, the second contact covers a second contact area on the outer electrical isolation layer, and the contact interconnector has a maximum interconnector cross sectional area, such that the first contact area and the second contact area are each larger than the maximum interconnector cross sectional area, creating a serpentine path for the vapor flow through the first inner adhesive layer, the second inner adhesive layer, the first outer adhesive layer and the second outer adhesive layer.

12. A thin profile, low impedance hermetic electrical connector as claimed in claim 11, wherein the conductive layer, the inner electrical isolation layer, the first inner adhesive layer, the outer electrical isolation layer, the first outer adhesive layer, the second inner adhesive layer, and the second outer adhesive layer are each substantially planar, of uniform thickness, and thin in cross section compared to area.

13. A thin profile, low impedance hermetic electrical connector as claimed in claim 2, wherein the contact interconnector is substantially perpendicular to the second inner adhesive layer, the inner electrical isolation layer, the first inner adhesive layer, the conductive layer, the first outer adhesive layer, the outer electrical isolation layer, and the second outer adhesive layer.

14. A thin profile, low impedance hermetic electrical cable end connector comprising:

a conductive layer with opposite first and second conductive layer surfaces;

a first electrical isolation layer coupled to the first conductive layer surface through a first adhesive layer;

a second electrical isolation layer coupled to the second conductive layer surface through a second adhesive layer;

a first conductor coupled to the second electrical isolation layer opposite the conductive layer through a third adhesive layer;

a first contact electrically coupled to the first conductor through a first interconnector;

a third electrical isolation layer coupled to the first conductor opposite the second electrical isolation layer through a fourth adhesive layer;

a second conductor coupled to the third electrical isolation layer through a fifth adhesive layer;

a second contact electrically coupled to the second conductor through a second interconnector; and a fourth electrical isolation layer coupled to the second conductor opposite the third electrical isolation layer through a sixth adhesive layer, wherein the first contact covers a first contact area and the second contact covers a second contact area on the first adhesive layer, the first interconnector has a maximum first interconnector cross sectional area and the second interconnector has a maximum second interconnector cross sectional area, and the first contact area and the second contact area are each larger than either the maximum first interconnector cross sectional area or the maximum second interconnector cross sectional area, creating a serpentine path for vapor flow through the hermetic electrical cable end connector.

* * * * *

UNITED STATES PATENT AND TRADEMARK OFFICE

CERTIFICATE OF CORRECTION

PATENT NO. : 5,573,428

DATED : November 12, 1996

INVENTOR(S) : Bradley M. Biggs et al.

It is certified that error appears in the above-identified patent and that said Letters Patent is hereby corrected as shown below:

In column 5, claim 1, line 33, delete "laver" and insert --layer--.

Signed and Sealed this

Ninth Day of September, 1997

Attest:

BRUCE LEHMAN

*Attesting Officer* *Commissioner of Patents and Trademarks*